United States Patent [19]
Pinckley

[11] Patent Number: 5,361,067
[45] Date of Patent: Nov. 1, 1994

[54] DIGITAL LINEARIZATION CALIBRATION FOR ANALOG TO DIGITAL CONVERTER

[75] Inventor: Danny T. Pinckley, Arlington, Tex.

[73] Assignee: Motorola Inc., Schaumburg, Ill.

[21] Appl. No.: 983,493

[22] Filed: Nov. 30, 1992

[51] Int. Cl.$^5$ ............................................. H03M 1/10
[52] U.S. Cl. .................................... 341/120; 341/155
[58] Field of Search ............... 341/118, 119, 120, 121, 341/155, 156, 157, 158, 166, 167

[56] References Cited

U.S. PATENT DOCUMENTS 4,736,189  4/1988  Katsumata et al. .................. 341/120
5,047,772  9/1991  Ribner ................................. 341/156

Primary Examiner—Brian K. Young
Attorney, Agent, or Firm—Richard A. Sonnentag; Kevin A. Buford

[57] ABSTRACT

A method and means are offered of providing of a calibrated output of a analog to digital converter. The method includes the steps of, and means for, generating a calibration table relating a calibrated output of the analog to digital converter and a detected output, and, upon determination of a need, providing, by reference to the calibration table, the calibrated output of the analog to digital converter corresponding to an detected output of the analog to digital converter.

30 Claims, 11 Drawing Sheets

20

DIGITAL LINEARIZATION CALIBRATION FOR ANALOG TO DIGITAL CONVERTER

FIELD OF THE INVENTION

The field of the invention relates to signal conversion and more specifically to analog to digital signal conversion.

BACKGROUND OF THE INVENTION

Analog to digital signal converters (ADCs) are known. Such converters are normally necessary where a digital device, such as a digital computer, must process inputs from non-digital signal sources. Examples of the use of such converter devices include the processing of analog inputs to digital communication systems, automobile engine sensors, and analysis of seismic information from seismic sensors.

ADCs typically provide a digital output proportional to the analog input. The number of bits available within the binary word, output from the device, typically provide a measure of resolution of the measured signal. Such resolution within the ADC is provided by a series of interrelated voltage references and/or voltage dividers within the ADC. Such references within the ADC are compared to an input during ADC operation under an algorithm providing a digital output proportional to the input. During manufacture the relative values of the reference voltages may be produced by a manufacturing process using etching, laser trimming, or other appropriate manufacturing technique.

To insure overall performance characteristics, ADCs are typically subject to the initial calibration during manufacture to ensure accuracy at two voltage extremes (high and low). Calibration at the two extremes insures that the output of the A/D is relatively accurate at the two extremes. Input voltage values between the two extremes, on the other hand, may exhibit considerable linearity error. The relative value of the linearity error between the two extremes is related to the manufacturing used to produce the proportional reference voltages.

Where reference voltages are produced using an etching process, linearity may be of a lesser quality. Where laser trimming is combined with etching then quality may be significantly improved and may offer a high-performance alternative where linearity requirements are restrictive in nature. Such high-performance alternatives, on the other hand, can be prohibitively expensive.

Total device accuracy is, typically, specified within the product literature of a device. Inaccuracies relative to non-linearity of device response may also be specified within device literature under a variety of different measuring methodologies. Accuracy may also drift, with time, as the ADC ages.

While ADCs perform well in converting analog data to a digital format, the accuracy of such devices may vary depending upon the magnitude of the sensed signal, and with time. ADCs may also vary in accuracy, from device-to-device. In addition, individual ADCs are sometimes constructed with phased clocks to increase their effective sampling rate, or in a composite offset structure, to increase their effective number of bits of resolution. Since multiple ADCs never have the same linearity characteristics, the composite structures suffer even worse linearity than any of their individual components. This creates particularly poor performance in spectral applications. Because of the importance of ADCs in signal processing a need exists for a method of improving the accuracy of A/D output data without resort to high-performance alternatives.

SUMMARY OF THE INVENTION

A method and means are offered of providing a calibrated output of a analog to digital converter. The method includes the steps of, and means for, generating a calibration table relating a calibrated output of the analog to digital converter and a detected output, and, upon determination of a need, providing, by reference to the calibration table, the calibrated output of the analog to digital converter corresponding to a detected output of the analog to digital converter.

DETAILED DESCRIPTION OF THE PREFERRED EMBODIMENT

The solution to the problem of correcting non-linearity of an ADC lies, conceptually, in providing, and referencing, a calibration table produced by calibrating the ADC against a reference standard. (Direct calibration of an ADC is difficult because of the digital nature of ADCs and because of an absence of a means for externally adjusting each of the converter output codes.) Because of the absence of an external means for adjusting for non-linearities, the converter is indirectly calibrated against a reference over a wide range of inputs, in accordance with the preferred embodiment, and the results stored in a look-up table. The look-up table is created by characterizing the uncalibrated (detected) outputs of the ADC over a range of inputs and associating with each detected output a substitute, calibrated output which minimizes the mean square error over the possible input range. In use, and upon determination of a need, the calibrated outputs are retrieved from the look-up table and substituted for uncalibrated (detected) outputs received from the ADC.

To produce a look-up table, an output of a calibration, digital to analog converter (DAC) is interconnected with an input of the ADC to be calibrated. A range of digital values are input to the DAC. For each digital value input to the DAC, a value is detected at the output of the ADC. The value at the detected output of the ADC and associated input value of the DAC are then stored in a look-up table. In use, the associated value from the look-up table is used in place of a value detected at the output of the ADC.

Figure 1:
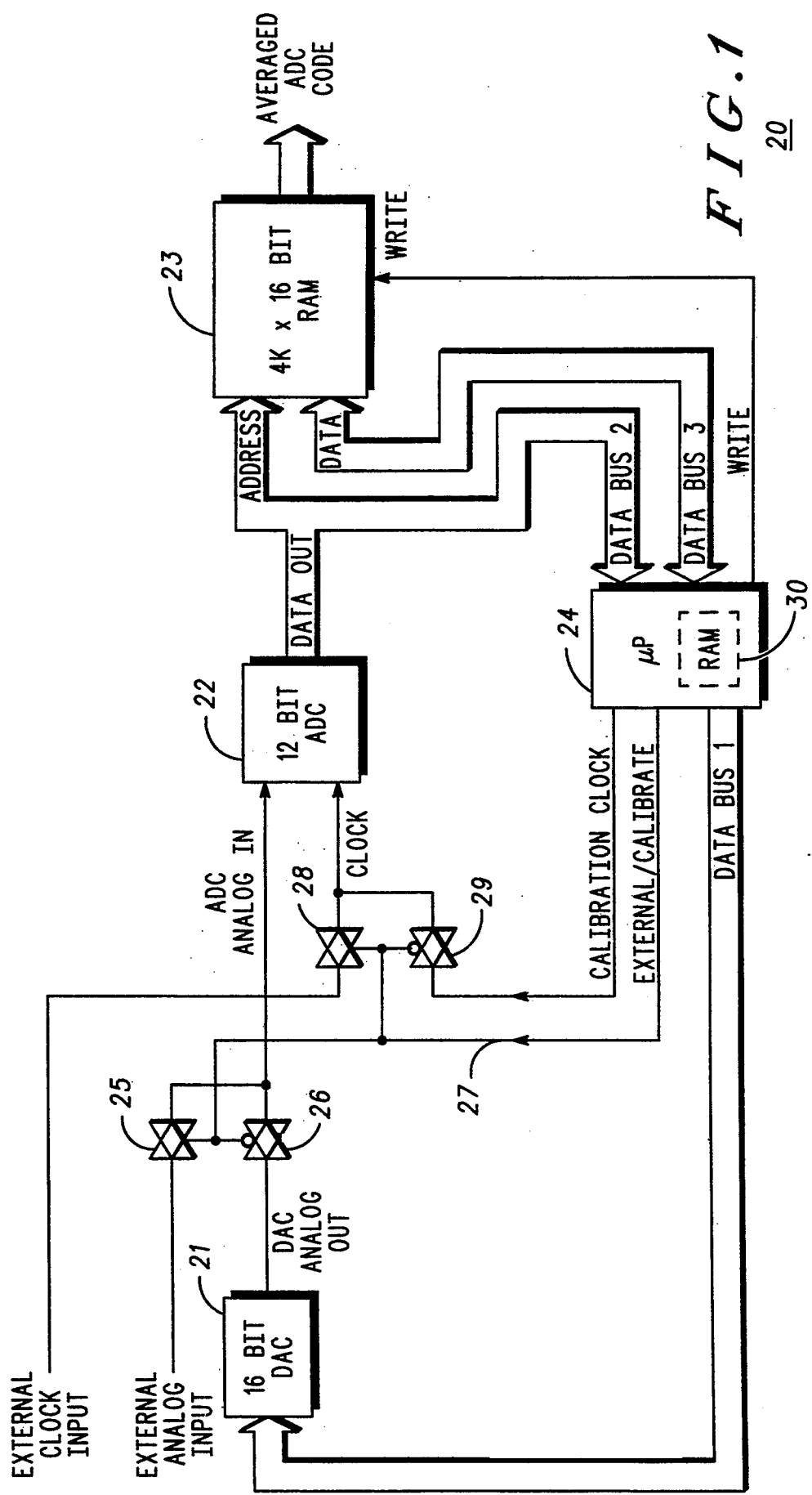
FIG. 1 comprises a block diagram of a analog to digital converter calibration system in accordance with one embodiment of the invention.

Shown in FIG. 1 is a block diagram of a portion of a data system, generally, (20) in accordance with one embodiment of the invention. Included within such a system (20) is a microprocessor (24), random access memory (RAM) (23), 12-bit ADC (22), 16-bit digital to analog converter (DAC) (21), and transmission gates (T-gates) (25, 26, 28, and 29). The T-gates (25, 26, 28, and 29) are on-off switches (transistors or relays) under control of the microprocessor (24) through control interconnect 27. The 16-bit DAC (21) is a reference device used in the calibration of the ADC (22).

Figure 2:
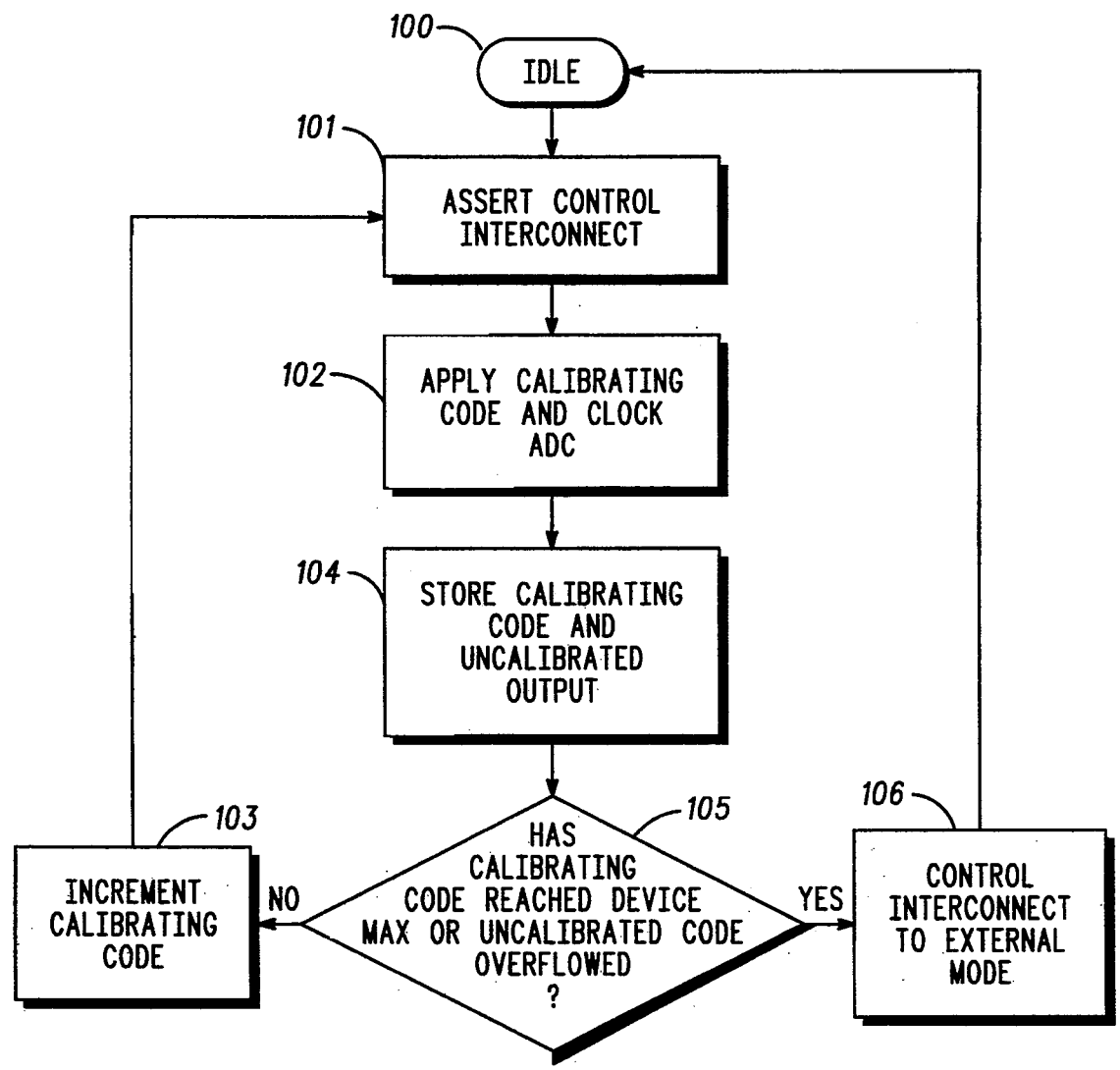
FIG. 2 comprises a flow chart of ADC calibration in accordance with the invention.

Shown in FIG. 2 is a flow chart of ADC calibration under the invention. Reference will be made to the flow chart as appropriate to an understanding of the invention.

The ADC (22) is calibrated by the microprocessor (24) by assertion (101) of a logical "0" on the control interconnect (27) to the T-gates (25, 26, 28, and 29). The logical "0" on T-gate (25 and 26) "opens" the signal input from the external analog input and "closes" the signal input from the DAC (21). The logical "0" on the T-gate (28 and 29) "opens" the clock input from the external clock input and "closes" the clock input from the calibration clock. The "0" isolates the ADC (22) from the external analog input and the external clock input and allows the application of a reference signal from the DAC (21), with a calibration clock, for calibrating the ADC (22).

To calibrate the ADC (22), a calibrating binary code is applied (102) to the DAC (21) through Data Bus 1 from the microprocessor (24). Upon application of a full range of known binary codes, the DAC (21) outputs an analog DC signal to the ADC (22) which is an accurate representation of the input binary code. The analog signal input (and clock signal) to the ADC (22) causes the ADC (22) to generate a detected output code from the ADC (22).

The ADC (22) is calibrated by application of an analog signal from the DAC (21) to the input of the ADC (22). The DAC (21), in accordance with the preferred embodiment, is chosen as a device offering a better accuracy and a higher resolution (16 bits versus 12 bits) than the device calibrated (ADC 22). The superior resolution of the DAC (21) offers the opportunity of identifying an average ADC code by locating a midpoint between DC input levels of the ADC (22) where adjacent bit transitions occur.

If DAC (21) were of identical bit size as ADC (22) (e.g. 12-bit resolution), and of identical accuracy, then the output of the ADC (22) would be identical to the calibrating code input to the DAC (21). Since the ADC (22) may not be of the same accuracy as the DAC (21) the calibrating code input to the DAC (21) may be considered as a calibrated output that one might expect from the output of the ADC (22). Under one embodiment of the invention the detected output of the ADC (22) is associated with a calibrating code input to the DAC (21), or an average of a range of calibrating codes input to the DAC (21) and stored (104) in a calibration, look-up table within memory (23) where the memory address is the uncalibrated code. Such an association allows for the generation of a calibrated output for each possible input to the ADC (22).

For the case in which the DAC (21) and ADC (22) are of identical bit size, the flow diagram in FIG. 2 is followed. After each calibrating code is applied (102), the calibrating code is stored (104) directly into the memory using the address of the uncalibrated code. If the last calibrating code has not been reached (105), the calibrating code is incremented and applied again to the ADC (22).

Figure 3:
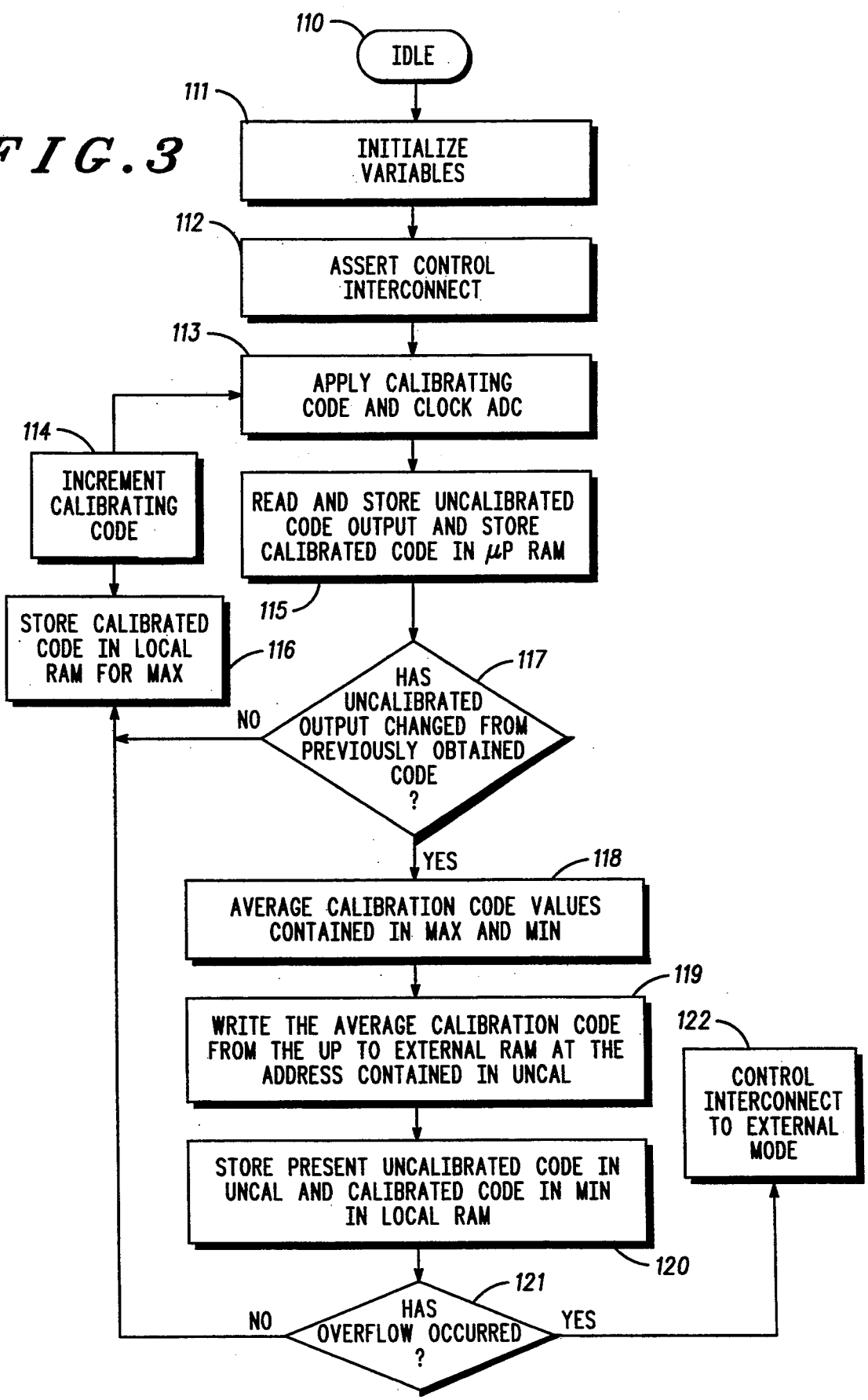
FIG. 3 comprises a flow chart of ADC calibration under an alternate embodiment of the invention.

In another application where the DAC (21) has better resolution (more bits) and better linearity than the ADC (22), a number of calibrating codes may be applied to the calibrating DAC (21) for each transition of the uncalibrated output of the ADC (22). The flow diagram in FIG. 3 applies to this case.

To accommodate the difference of resolution between the DAC (21) and the ADC (22), an average (averaged ADC code) of some of the calibrating codes is used to represent the calibrated output of the ADC (22) for each uncalibrated output. In this case, upon application of each calibrating code to the DAC (21), the uncalibrated ADC code is compared (117) to the uncalibrated code obtained from the previous application of the calibrating code. If the uncalibrated code has not changed, the calibrating code is incremented (114) and applied again (113) to the DAC (21). If the uncalibrated code has changed, then the averaged ADC code is calculated (118) for the previous uncalibrated code as the average of the calibrating codes applied to produce the same uncalibrated ADC output code.

Rather than averaging all of the codes with the same uncalibrated ADC output, it is simpler, under the preferred embodiment, to average (118) only the minimum and maximum calibrating codes producing the uncalibrated code. This averaged ADC code is then associated with the uncalibrated code used to create it by storing (119) the averaged ADC code into memory at the address of the uncalibrated code. This procedure continues until all calibrating codes have been exhausted or the calibrating voltage level into the ADC (22) exceeds the digitization limits of the ADC (121).

The use of average calibrating codes as a calibrated output for each output of the ADC (22) beneficially mitigates the uncertainty of signal inputs to the ADC (22) between transitions and allows for the least average squared error between transitions. The average calibrating codes, in such case, must have more bits than the uncalibrated output to improve its accuracy in terms of linearity and spectral performance. The use of the calibrating codes (and DAC 21) also allows the ADC (22) to be characterized over a range of inputs, from a minimum to a maximum (105). Since the uncalibrated outputs of the ADC (22) would not be expected to change significantly between calibrations the use of a calibrated output for each received output of the ADC (22) provides a convenient method of improving the accuracy of an otherwise inaccurate ADC (22).

In another embodiment of the invention a calibrated output of the ADC (22) may be determined for each measurement of the ADC (22). Under such an embodiment an uncalibrated output of the ADC (22) is stored within local memory (25) within the microprocessor (24). To establish a calibrated output the microprocessor (24) interrupts input to the ADC (22) through assertion of control interconnect (27). The microprocessor (24) then determines a calibrated output by asserting a number of calibrating codes to the DAC (21) until an output is again detected at the output of the ADC (22) matching the detected output stored in memory (25).

If the number of DAC (21) and ADC (22) bits are equal, the first calibrating code corresponding to the uncalibrated value is used as the calibrated code. If the DAC (21) has more bits than the ADC (22), the minimum and maximum calibrating DAC codes that correspond to the uncalibrated ADC code are averaged, stored in memory, and used as the calibrated code.

Figure 4:
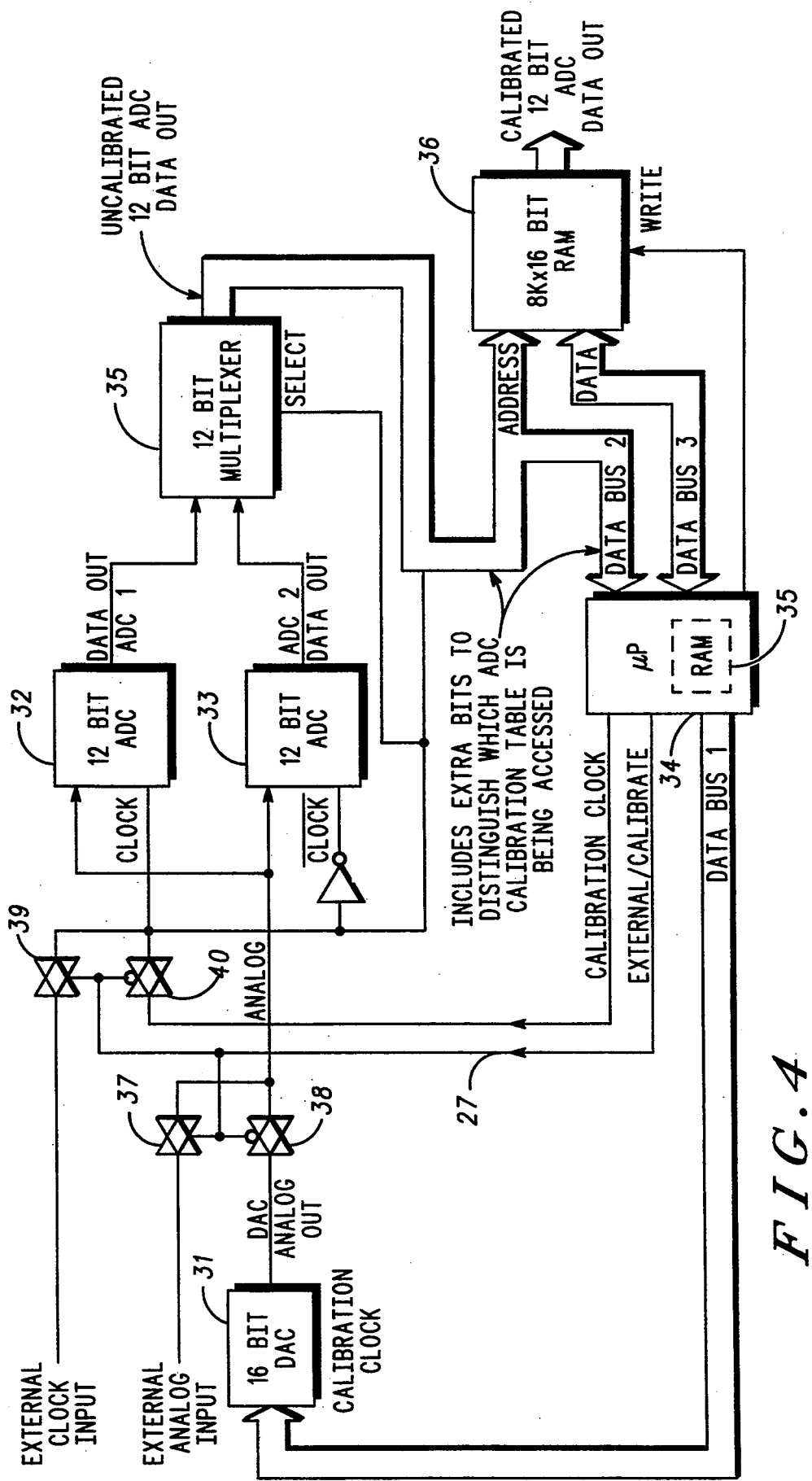
FIG. 4 comprises a block diagram of calibration apparatus under an alternate embodiment of the invention.

In another embodiment of the invention, the DAC (21) is used to calibrate multiple ADCs (22) clocked at different times (e.g., at a first phase based upon a clock pulse and at an at least second phase based upon an inverse of the clock pulse or some other phase parameter of the clock). An example, with two ADCs (32 and 33) is shown in FIG. 4. The ADCs (32 and 33) are clocked at time offsets, $T_S/N$, when the circuit is operating normally (not during calibration), where $T_S$ is the time between samples for each ADC and N is the number of ADCs. Calibration for this multiple ADC configuration is similar to that with one ADC except that the calibrated output codes are differentiated with respect to which ADC they correspond. Additional address bits for the memory are used to distinguish calibration codes for the different ADCs.

Figure 5:
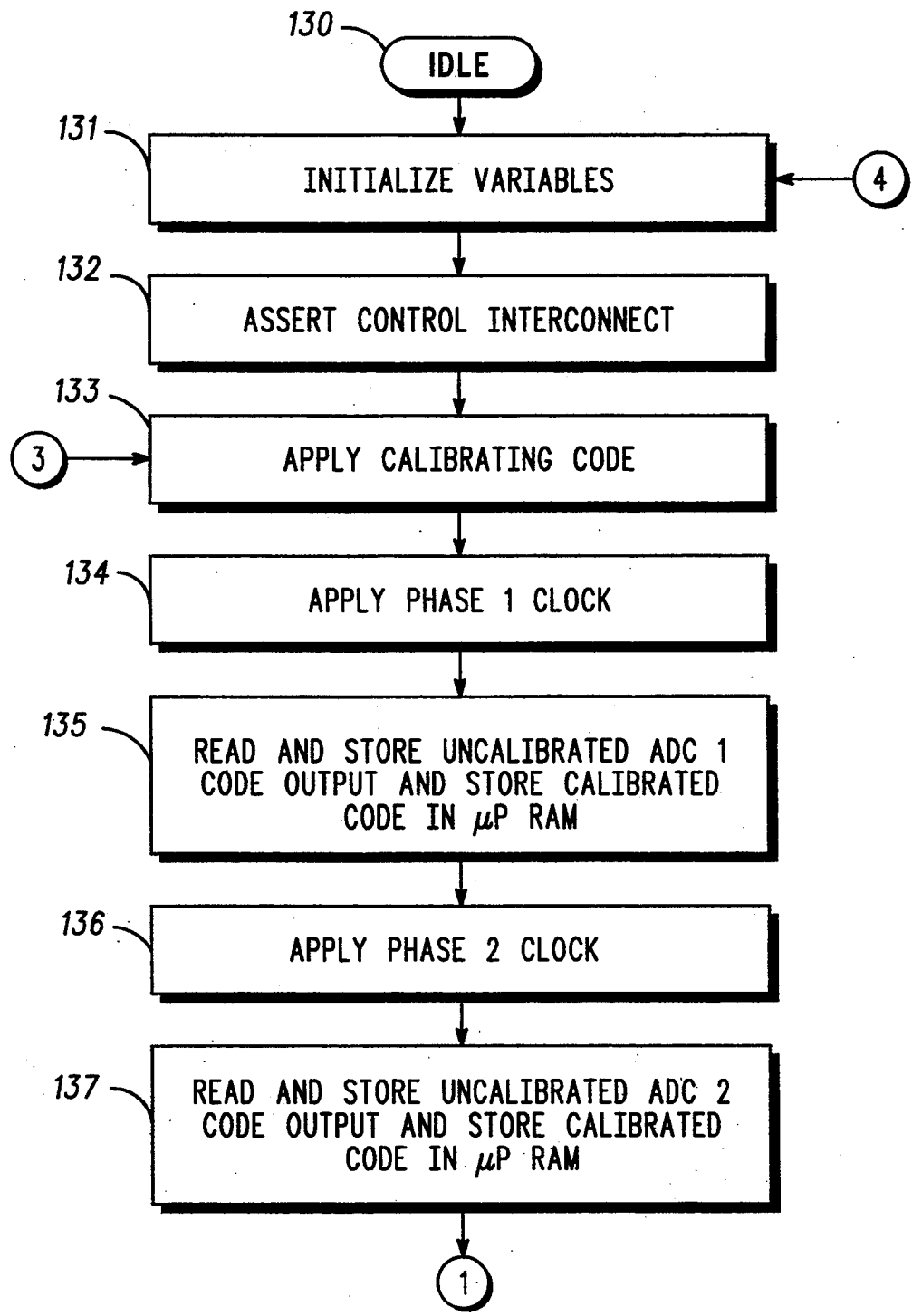
FIGS. 5-7 comprises a flow chart of ADC calibration under an alternate embodiment of the invention.
Figure 6:
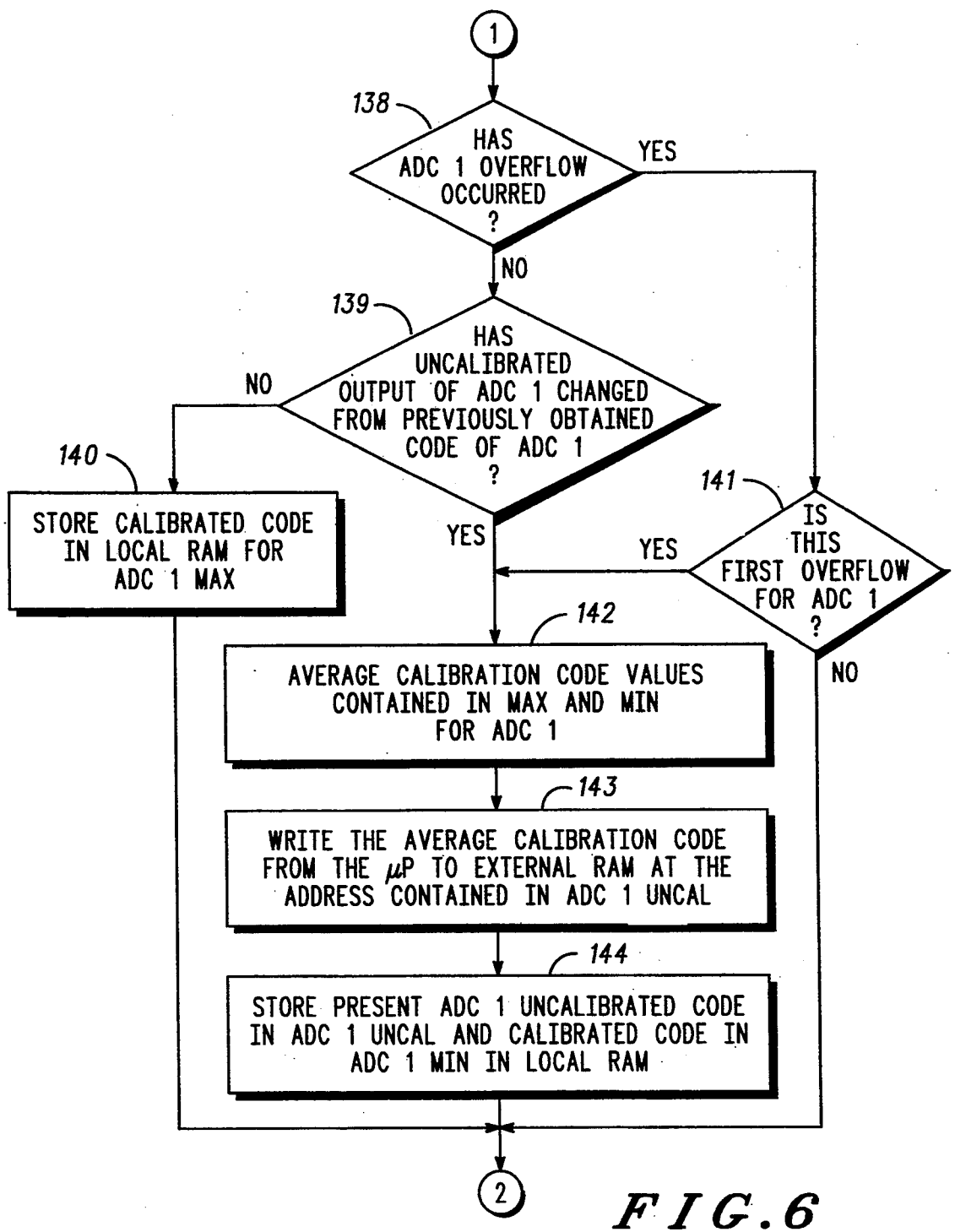
Figure 7:
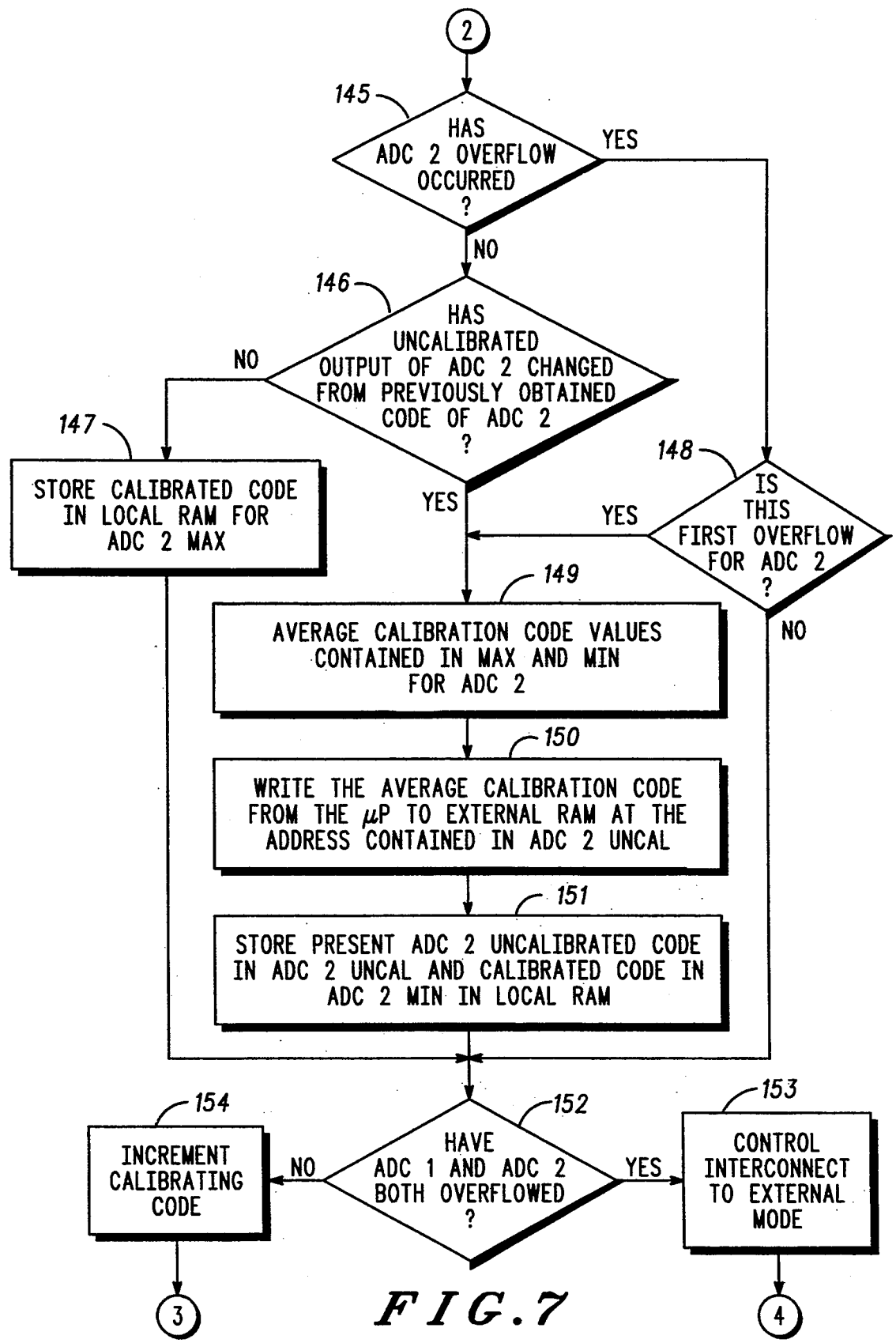

One possible calibration procedure is demonstrated in FIGS. 5-7. The block of ADCs (32 and 33) is configured for calibration, a calibration code is applied (133) to the DAC (31), ADC 1 (32) is clocked with the phase 1 (134) clock to take a sample, that sample is then read by the microprocessor (34) and stored (135) in its local RAM (35). ADC 2 (33) is then clocked (136) and its sample is read and stored (137). Each uncalibrated sample is tested to determine if the end of calibration is reached (141 and 148) for that device, and the final calculations are made (142, 143, 144, 149, 150, and 151) if the end is reached.

If not at the end of the calibration cycle, it is determined if the uncalibrated output of each ADC (32 and 33) has changed since the last calibrating code was applied. If not, the uncalibrated outputs are stored in local memory (35), and the calibration continues with the application of another calibrating code (133). If the uncalibrated output of either ADC has changed (139, 146) since the last calibrating code was applied, a new averaged ADC code for that particular ADC (32 or 33) is calculated from the average of the minimum and maximum calibrating codes producing the same previously obtained uncalibrated output. This averaged code is stored in memory using an address which is composed of the uncalibrated output and 1 bit denoting to which ADC (32 or 33) the averaged ADC code corresponds. This proceeds until all uncalibrated outputs have been assigned an averaged ADC code.

Of course, it is evident that this could be extended to more ADCs by simply adding more equally spaced clock phases and more bits to differentiate which uncalibrated code corresponds to which ADC.

Figure 8:
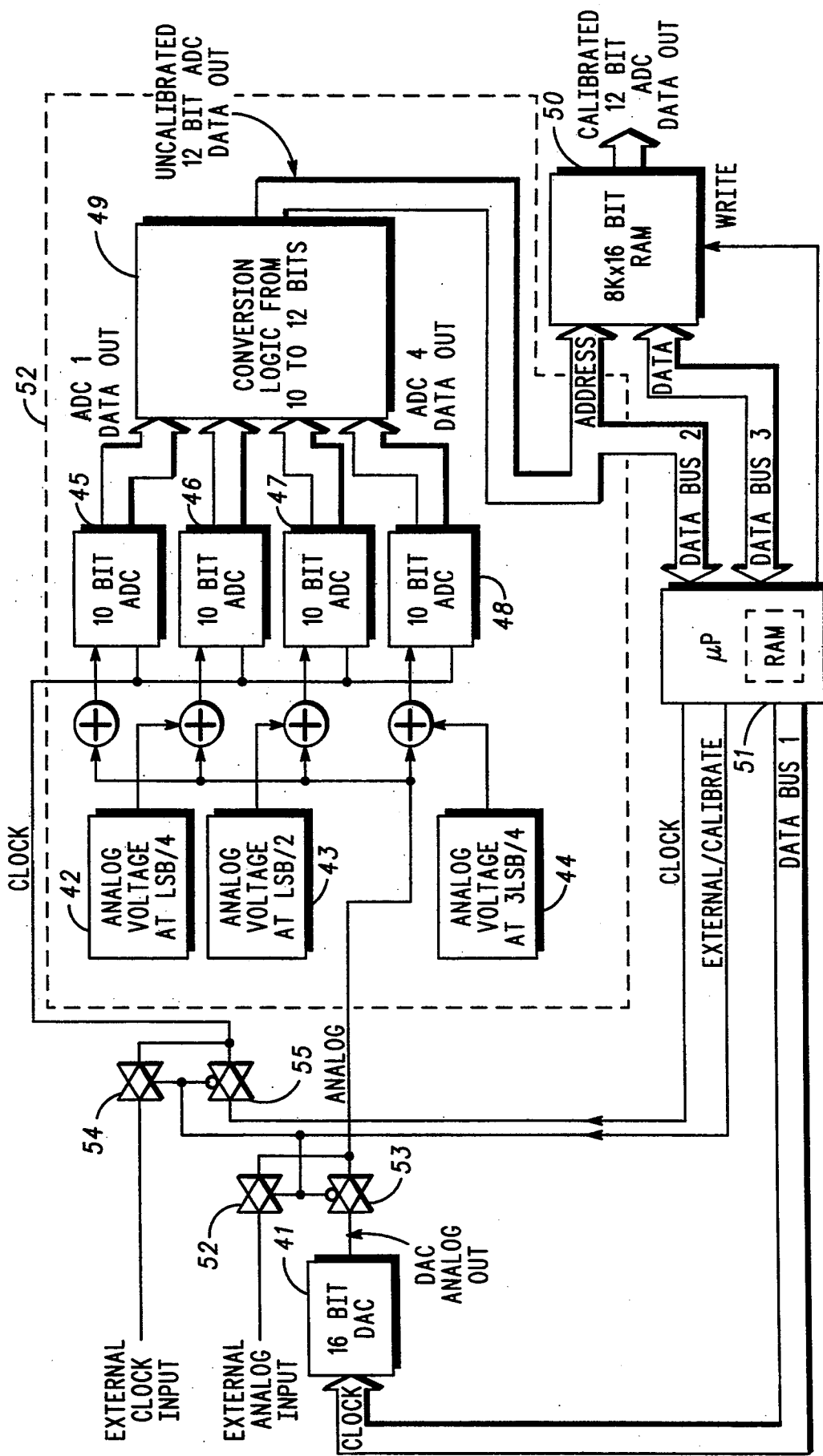
FIG. 8 comprises a block diagram of ADC calibration using offsets under one embodiment of the invention.

In another embodiment of the invention, a DAC (41) is used to calibrate a composite of multiple ADCs (45-48) which are summed (49) with different offsets (offset factors) to increase the total resolution as shown in FIG. 8. Offset factors are calculated by determining an input signal value required to cause a change in the least significant bit of the composite ADC (45-48), dividing by the number of ADCs (45-48) (composite number), and multiplying by a respective ADC number (e.g., 0-3). The outputs of the four 10-bit ADCs are mapped into one equivalent 12-bit ADC output. This is done by appending two extra bits to each of the four ADCs to represent their added DC offsets (e.g., 00, 01, 10, or 11), adding the resulting four 12-bit numbers, subtracting six for the sum of the DC offsets, and dividing by 4. The upper 12 bits are then the resultant uncalibrated output code, represented by more bits than each individual ADC.

In this case, the intent is to improve the resolution of the composite ADC over the resolution of the individual ADCs (45-48) by $\log_2$ (N) bits where N is the number of ADCs (45-48) used. This means that the linearity and resolution of the calibrating DAC (41) must be at least $\log_2$ (N) bits better than each individual ADC. This is generally calibrated like the ADC in FIG. 1, where the components inside the dashed lines (52) are treated like the ADC block in FIG. 1. The distinction here is that the calibration method increases the accuracy sufficiently to make the structure of the composite ADC shown inside the dashed lines useful for spectral applications.

Of course, the composite structure in FIG. 8 and the multiple sample time structure in FIG. 4 could be merged to form another structure which would benefit from this compensation.

Figure 9:
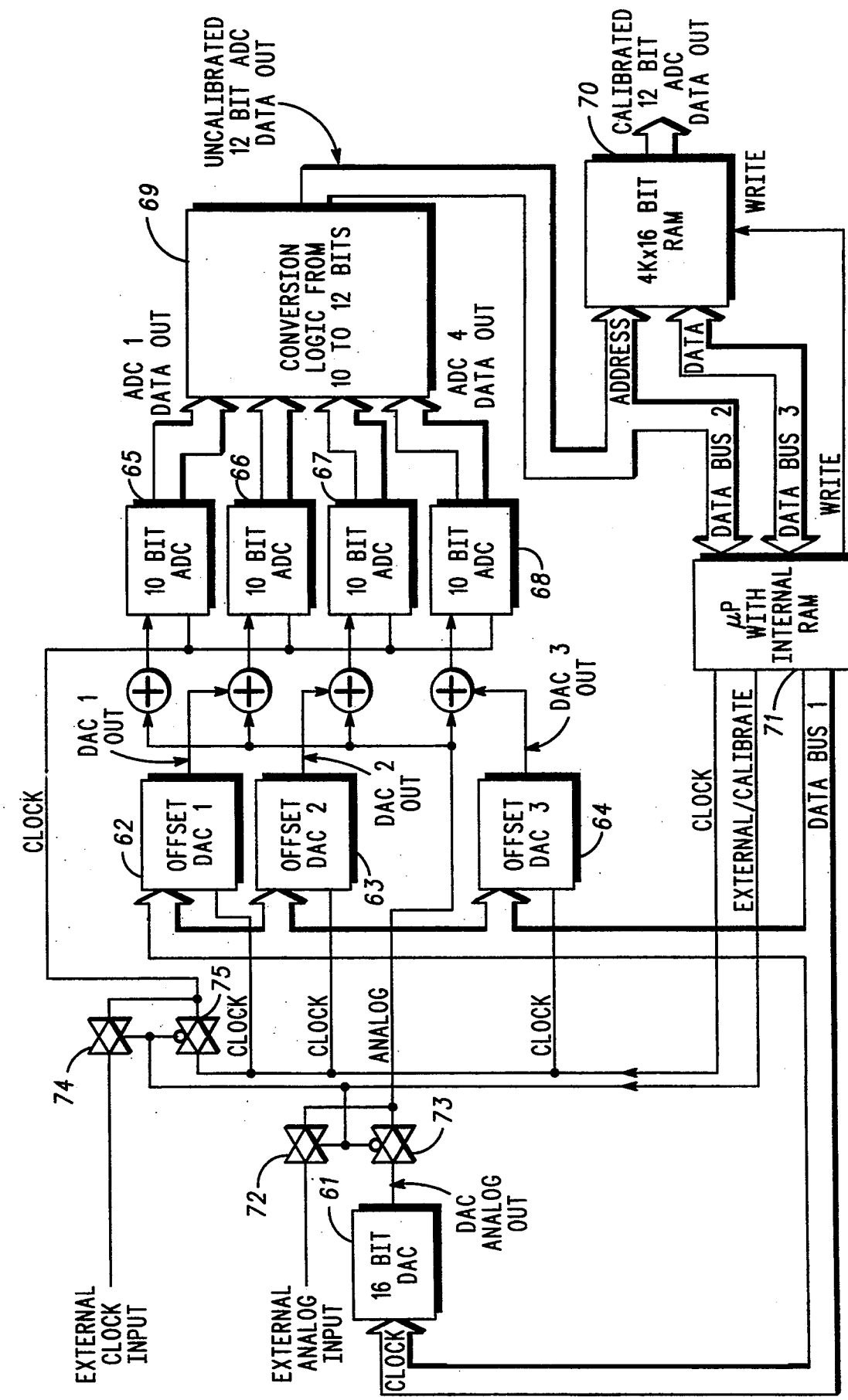
FIG. 9 comprises a block diagram of ADC calibration using adaptive offsets under another embodiment of the invention.

In another embodiment of the invention, a DAC is used to calibrate a composite structure (FIG. 9) similar to that of FIG. 8, but its individual offsets are also adjusted with additional DACs (62-64) to optimize for minimum weighted squared error from the ideal transfer function over the range of inputs considered most important.

Figure 10:
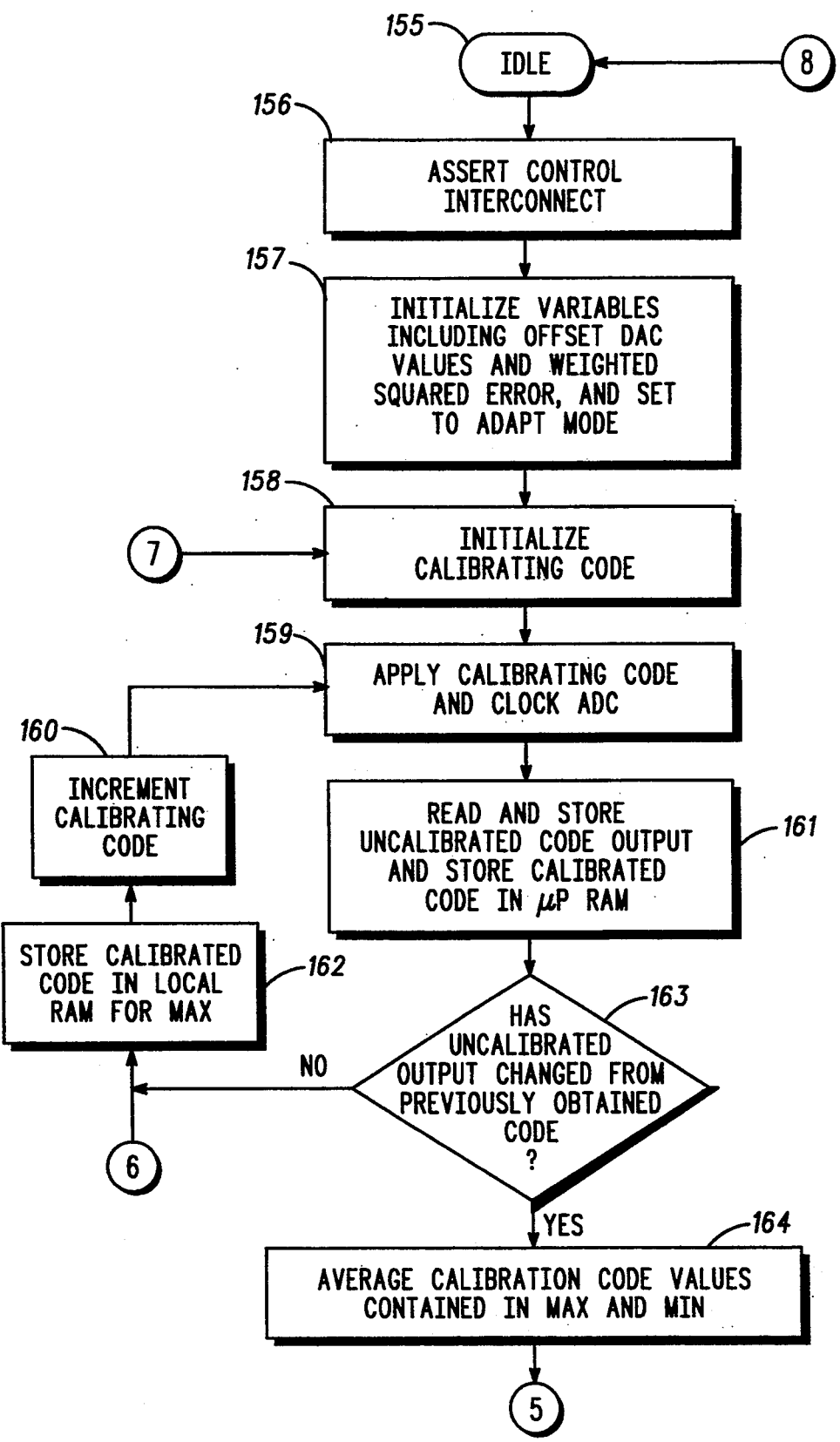
FIGS. 10-11 comprises a flow chart of an alternate embodiment of the invention.
Figure 11:
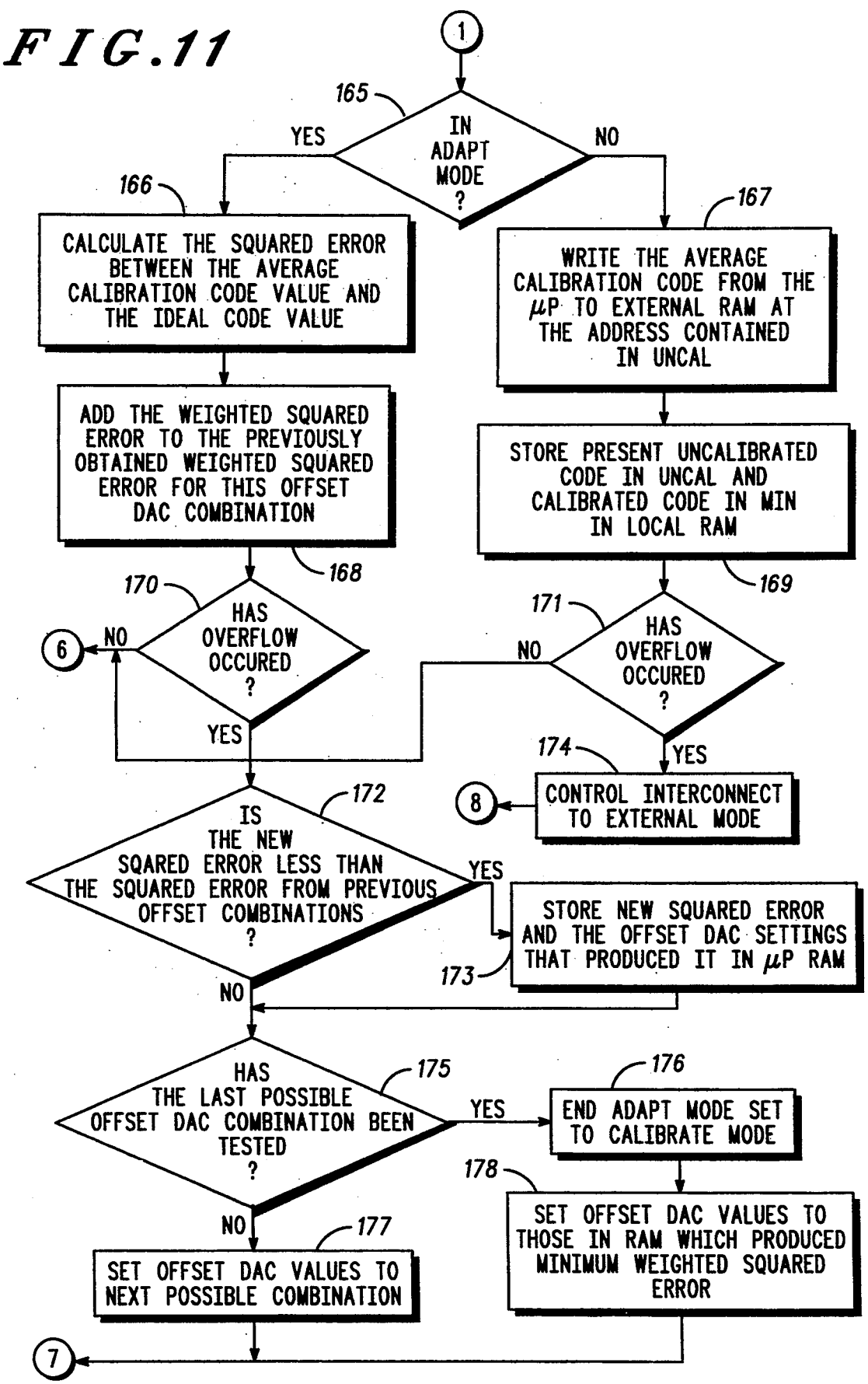

One possible calibration and adaptation procedure for this configuration is shown in FIGS. 10-11. This describes the most obvious procedure, which is an exhaustive search. Each of the Offset DACs (62-64) is set to its minimum value, initially. Starting with a minimum value, different calibrating DAC values are clocked into the ADCs, and the averaged ADC code is determined (164) for each possible unique uncalibrated output code, as done in previous examples. Then the difference between this averaged calibrating code value and the expected ideal value is calculated, squared, and weighted by a predetermined function. It is then added (168) to the previously obtained total of weighted squared error from the other output codes and stored in the microprocessor.

This process continues until all output codes have been evaluated, and the total weighted squared error calculated. The offset of one of the offset DACs is then incremented (177) and the resulting total weighted squared error from its ideal transfer function is calculated. The microprocessor compares the weighted squared errors for the offset DAC settings (172) and retains the information (173) of which settings produced the minimum weighted squared errors so far. When all possible offset DAC settings have been tried, the microprocessor sets the offset DACs to the values which produced the minimum weighted squared error over the input range (178) and repeats the calibration process determining the averaged ADC code for each uncalibrated output code. The averaged ADC codes are stored in RAM as they are calculated (167). When the microprocessor sets the circuit back to external mode (174), the ADC substitutes the calibrating code for the uncalibrated ones in normal use.

The process of the last paragraph could also be accomplished using mean weighted square errors instead of weighted square errors by simply dividing the weighted square errors by the number of error terms used in the sum. This step is usually omitted because the number of error terms is usually the same for all cases being compared.

I claim:

1. A method of providing a calibrated output of an analog to digital converter, such method comprising the steps of: generating a calibration table relating a calibrated output of the analog to digital converter and a detected output; interconnecting an output of a reference digital to analog converter to an input to the analog to digital converter; incrementally applying an input to the reference digital to analog converter from a minimum input value to a maximum input value; storing an average input value of the reference digital to analog converter, measured between changes in the detected output, as a calibrated output value of the analog to digital converter and corresponding detected output of the analog to digital converter in the calibration table; and, in response to an external analog signal input to the analog to digital converter being converted to a signal approximately equal to the stored detected output, providing, by reference to the calibration table, the stored calibrated output corresponding to the detected output as a calibrated digital output representation of the external analog signal.

2. The method of claim 1 further comprising the step of storing the calibrated output value of the analog to digital converter at an address determined, in part, by the numerical value of the detected output.

3. A method of providing a calibrated output Of a composite analog to digital converter having a plurality of analog to digital converters, equal to a composite number, and a composite output determined by a detected output, such method comprising the steps of: storing during a first phase, an input value of a reference digital to analog converter as a calibrated output value of a first analog to digital converter of the composite analog to digital converter and corresponding detected output of the first analog to digital converter in a calibration table; and storing, during a second phase, an input value of the reference digital to analog converter as a calibrated output value of a second analog to digital converter of the composite analog to digital converter and corresponding detected output of the second analog to digital converter in the calibration table.

4. The method of claim 3 further comprising the step of storing the calibrated output value of each of the first and second analog to digital converters at an address determined, in part, by the phase of the composite analog to digital converter and detected output.

5. The method as in claim 3 further comprising the step of storing, during a first phase, an average input value of the reference digital to analog converter, measured between changes in the detected output during the first phase, as a calibrated output value of a first analog to digital converter of the composite and corresponding detected output of the first analog to digital converter in the calibration table.

6. The method as in claim 5 further comprising the step of storing, during an at least second phase, an average input value of the reference digital to analog converter, measured between changes in the detected output during the at least second phase, as a calibrated output value of an at least second analog to digital converter of the composite and corresponding detected output of the at least second analog to digital converter in the calibration table.

7. The method of claim 6 further comprising the step of storing the calibrated output value of each of the first and second analog to digital converters at an address determined, in part, by the phase of the analog to digital converter and detected output.

8. The method as in claim 3 further comprising the step of calculating an offset factor for each analog to digital converter, of the composite, by dividing an analog signal value, producing a least significant bit incremental change of an output of an analog to digital converter of the composite, by the composite number and multiplying by a respective analog to digital converter number of the composite to produce a number of respective, calculated offset factors equal to the composite number.

9. The method as in claim 8 further comprising the step of applying, as an input to each analog to digital converter of the composite, a sum of the output of the reference digital to analog converter and the respective, calculated offset factor to produce an output of each analog to digital converter of the composite.

10. The method as in claim 9 further comprising the step of summing the outputs of the analog to digital converters, of the composite, to produce a summed output, subtracting the calculated offset factors from the summed output, and dividing by the composite number to produce a composite analog to digital converter output.

11. The method as in claim 10 further comprising the step of storing the input value of the reference digital to analog converter as a calibrated output value and corresponding output value of the composite analog to digital converter in the calibration table as the detected output.

12. The method of claim 11 further comprising the step of storing the calibrated output value at an address determined, in part, by the numerical value of the detected output.

13. The method as in claim 10 further comprising the step of storing an average input value of the reference digital to analog converter, measured between changes in the detected output, as a calibrated output value and corresponding output value of the composite analog to digital converter in the calibration table as the detected output.

14. The method of claim 13 further comprising the step of storing the calibrated output value at an address determined, in part, by the numerical value of the detected output.

15. The method as in claim 8 further comprising the step of determining an offset factor for each analog to digital converter, of the composite, by individually incrementing each offset digital to analog converter providing an input to each analog to digital converter, of the composite, from a minimum to maximum, calculating a calibrated input value and a mean weighted square error for each output of the composite analog to digital converter for each reference digital to analog converter output from a minimum to a maximum value, and selecting offset factors producing the lowest magnitude mean weighted square error.

16. The method as in claim 15 further comprising the step of applying, as an input to each analog to digital converter, of the composite, a sum of the output of the reference digital to analog converter and the respective, selected offset factor to produce an output of each analog to digital converter of the composite.

17. The method as in claim 16 further comprising the step of summing the outputs of the analog to digital converters, of the composite, to produce a summed output, subtracting the calculated offset factors from the summed output, and dividing by the composite number to produce a composite analog to digital converter output.

18. The method as in claim 17 further comprising the step of storing the input value of the reference digital to analog converter as a calibrated output value and corresponding output value of the composite analog to digital converter in the calibration table as the detected output.

19. The method of claim 18 further comprising the step of storing the calibrated output value at an address determined, in part, by the numerical value of the detected output.

20. The method as in claim 17 further comprising the step of storing an average input value of the reference digital to analog converter, measured between changes in the detected output, as a calibrated output value and corresponding output value of the composite analog to digital converter in the calibration table as the detected output.

21. The method of claim 20 further comprising the step of storing the calibrated output value at an address determined, in part, by the numerical value of the detected output.

22. The method as in claim 8 further comprising the step of determining an offset factor for each analog to digital converter, of the composite, by individually incrementing each offset digital to analog converter providing an input to each analog to digital converter, of the composite, from a minimum to maximum, calculating an averaged calibrated input value and a mean weighted square error for each output of the composite analog to digital converter for each reference digital to analog converter output from a minimum to a maximum value, and selecting offset factors producing the lowest magnitude mean weighted square error.

23. The method as in claim 22 further comprising the step of applying, as an input to each analog to digital converter, of the composite, a sum of the output of the reference digital to analog converter and the respective selected offset factor to produce an output of each analog to digital converter of the composite.

24. The method as in claim 23 further comprising the step of summing the outputs of the analog to digital converters, of the composite, to produce a summed output, subtracting the calculated offset factors from the summed output, and dividing by the composite number to produce a composite analog to digital converter output.

25. The method as in claim 24 further comprising the step of storing the input value of the reference digital to analog converter as a calibrated output value and corresponding output value of the composite analog to digital converter in the calibration table as the detected output.

26. The method of claim 25 further comprising the step of storing the calibrated output value at an address determined, in part, by the numerical value of the detected output.

27. The method as in claim 24 further comprising the step of storing an average input value of the reference digital to analog converter, measured between changes in the detected output, as a calibrated output value and corresponding output value of the composite analog to digital converter in the calibration table as the detected output.

28. The method of claim 27 further comprising the step of storing the calibrated output value at an address determined, in part, by the numerical value of the detected output.

29. A self-calibrating analog to digital converter comprising: means for generating a calibration table relating a calibrated output of the analog to digital converter and a detected output; means for interconnecting an output of a reference digital to analog converter to an input to the analog to digital converter; means for incrementally applying an input to the reference digital to analog converter from a minimum input value to a maximum input value; storing an average input value of the reference digital to analog converter, measured between changes in the detected output, as a calibrated output value of the analog to digital converter and corresponding detected output of the analog to digital converter in the calibration table; and look-up means for, in response to an external analog signal input to the analog to digital converter being converted to a signal approximately equal to the stored detected output, providing, by reference to the calibration table, the stored calibrated output corresponding to the detected output as a calibrated digital output representation of the external analog signal.

30. A self-calibrating composite analog to digital converter comprising:
a plurality of analog to digital converters, equal to a composite number, and including a first and second analog to digital converter, all operatively coupled together for outputting a composite output signal;
a reference digital to analog converter operatively coupled to an input of the plurality of analog to digital converters for converting first and second input values into first and second analog signals, respectively, for input to the first and second analog to digital converters, respectively;
a reference signal generator operable for generating known input values including the first and second input values;
a memory operatively coupled to the plurality of analog to digital converters and the reference signal generator for storing during a first phase the first input value generated by the reference signal generator as a calibrated output value of the first analog to digital converter and a corresponding detected output of the first analog to digital converter in a calibration table, and for storing, during a second phase, the second input value as a calibrated output value of the second analog to digital converter and a corresponding detected output of the second analog to digital converter in the calibration table.

* * * * *